United States Patent
Geefay

(10) Patent No.: US 6,555,440 B1
(45) Date of Patent: Apr. 29, 2003

(54) PROCESS FOR FABRICATING A TOP SIDE PITTED DIODE DEVICE

(75) Inventor: Frank Sigming Geefay, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 125 days.

(21) Appl. No.: 09/587,720

(22) Filed: Jun. 5, 2000

(51) Int. Cl.⁷ .................................. H01L 21/8222
(52) U.S. Cl. .................. 438/328; 438/48; 438/22; 438/23; 438/24; 438/979; 438/983; 257/21; 257/82; 257/84; 257/104; 257/105; 257/106
(58) Field of Search ............... 438/328, 48, 22–24, 438/979, 983; 257/21, 82, 84, 104–106

(56) References Cited

U.S. PATENT DOCUMENTS

| | | | |
|---|---|---|---|
| 4,131,488 A | | 12/1978 | Lesk et al. ............. 148/1.5 |
| 4,173,765 A | * | 11/1979 | Heald et al. ............ 357/23 |
| 4,224,734 A | | 9/1980 | Tiefert et al. ........... 29/583 |
| 4,738,933 A | * | 4/1988 | Richards .............. 437/15 |
| 4,904,607 A | | 2/1990 | Riglet et al. ............ 437/3 |
| 5,239,193 A | | 8/1993 | Benton et al. ........... 257/292 |
| 5,268,310 A | | 12/1993 | Goodrich et al. ........ 437/15 |
| 6,027,956 A | | 2/2000 | Irissou ................. 438/68 |
| 6,174,365 B1 | * | 1/2001 | Sanjoh ................. 117/68 |

FOREIGN PATENT DOCUMENTS

| | | | | |
|---|---|---|---|---|
| JP | 57-167685 | * | 10/1982 | ......... H01L/29/91 |
| JP | 59-3961 | * | 10/1984 | ......... H01L/25/08 |
| JP | 4-76963 | * | 3/1992 | ......... H01L/29/91 |

OTHER PUBLICATIONS

Buted, Rolando and Saka, Paul, "The Pitted Pin Diode," Hewlett–Packard, Feb. 9, 1982.

* cited by examiner

Primary Examiner—Matthew S. Smith
Assistant Examiner—Granvill D. Lee, Jr.

(57) ABSTRACT

A method of fabricating a diode device, such as a PIN diode, includes forming top and bottom regions of opposite conductivity types and includes anisotropically etching into the top surface to form a pit having side walls that converge with approach to the bottom surface. However, the pit does not extend to the bottom surface. In the PIN diode embodiment, the pit terminates within an intrinsic region that separates a bottom surface diffusion region from a diffusion region along the walls of the anisotropically etched pit. The anisotropic etching approach provides a degree of self regulation with regard to the geometries of the pit. A process flow of steps is described, which allows thicker and larger diameter wafers to be used in the formation of an array of such diode device.

18 Claims, 12 Drawing Sheets

US 6,555,440 B1

PROCESS FOR FABRICATING A TOP SIDE PITTED DIODE DEVICE

TECHNICAL FIELD

The invention relates generally to semiconductor devices and more particularly to methods of fabricating diode devices, including PIN diodes.

BACKGROUND ART

There are a number of alternative architectures for forming diode devices. Typically, contacts for a P-doped region and an N-doped region are on a single side of a semiconductor substrate in which the PN junction is formed. The two regions are formed in separate diffusion steps that implant dopants from the same substrate side.

Another available architecture is one in which the P-doped and N-doped regions are on opposite sides of a substrate. This architecture is particularly suitable for fabricating PIN diodes, since these diodes require an intermediate intrinsic region. PIN diodes may be used as RF (radio frequency) attenuators and switches. When a forward bias is applied to the diode, holes and electrons are created and then combined in the intrinsic region, so that forward conduction can occur. Removing the forward bias does not immediately cease conduction of current, since the charge carriers require some time to recombine. As a result, a high frequency signal may be superimposed on the forward bias current. The PIN diode then functions as a current controlled resistor that presents a linear resistance to the flow of RF current through the diode. At high frequencies, the resistance decreases the forward bias current increases. If the current is used to switch the PIN diode, the diode can be used for phase shifting or pulse modulation.

The series resistance (Rs) of the PIN diode is generally insensitive to the junction areas of the intrinsic region with the P-doped and N-doped regions, but is very sensitive to the thickness of the intrinsic region between the two junction areas. Rs varies roughly as the square of the intrinsic region distance. One known method for controlling the distance between the junctions is to isotropically form a pit in the back side of the substrate 10, as shown in FIG. 1. While the drawing is not shown to scale, the thickness of the substrate 10 may be 76.8 microns, while the depth of the bottom side pit may be 45.2 $\mu$m. An acceptable effective thickness (W) between a top P-diffusion region 12 and a bottom N-diffusion region 14 is 14.7 microns, with the thickness of the top diffusion region being 4.3 microns, and the thickness of the bottom diffusion region being 12.6 microns. The PIN diode 16 of FIG. 1 also includes a bottom side metallization 18, which may be a combination of a nickel/gold alloy and a gold plating. A channel stop 20 is formed by providing a ring diffusion of a dopant, such as phosphorous, to provide an N-type channel stop. The channel stop forms a reverse junction at the surface of the substrate 10 to inhibit leakage of current flow as a result of surface inversion. The top P-diffusion region 12 may be formed by introducing boron into the substrate, while the bottom N-diffusion region may be formed by introducing phosphorous.

The PIN diode 16 also includes a patterned oxide layer 22 and a patterned nitride layer 24. Openings are formed through these layers 22 and 24 to expose a portion of the top P-diffusion region 12. A gold button 26 is deposited within the exposed area in order to provide an ohmic contact with the top P-diffusion region. Typically, there is a metallization that is deposited prior to the gold button. For example, a first layer of titanium and a second layer of platinum may be formed prior to the gold button.

One concern with the prior art process relates to the alignment of the bottom side pit 28 with the top side junction. A specially designed infrared mask aligner has been used, but the aligner is relatively ineffective if the intrinsic region has a thickness (W) greater than 100 microns. Moreover, the etching of the pits 28 is sometimes problematic, since it requires wax mounting of the wafer and spot etching in order to achieve uniformity. Utilizing wafers having a thickness of greater than 177.8 microns is not a consideration. Because of the breakage concerns that result from using relatively thin substrates, silicon wafers having a diameter of approximately 50.8 millimeters are typically used. As a result, the cost savings that are associated with economies of scale are limited.

Another diode device architecture is described in U.S. Pat. No. 5,268,310 to Goodrich et al. The architecture provides a mesa-type PIN diode which preferably takes the shape of a truncated frustum of a cone. The fabrication of the PIN diode includes providing a substrate having an N-type conductivity. An intrinsic semiconductor layer (preferably silicon) is epitaxially formed on the top surface of the substrate. Within a top region of the epitaxial intrinsic layer, boron is implanted in order to provide the P-type junction. The side walls of the mesa-shaped intrinsic semiconductor layer are doped with phosphorous in order to provide an N-type region. While the structure operates well for its intended purpose, the fabrication process can be costly.

What is needed is a method of fabricating a diode device that provides a level of scalability which accommodates fabrication cost efficiency. What is further needed is a PIN diode device that is formed by such a method.

SUMMARY OF THE INVENTION

A method of fabricating a diode device in a <100> crystal oriented silicon substrate having a top surface and a bottom surface includes forming top and bottom regions of opposite conductivity types and anisotropically etching into the top surface to form an inverted pyramidal pit that terminates prior to reaching the bottom surface. In the preferred embodiment, the diode device is a PIN diode that is formed simultaneously with an array of PIN diodes in an unconventionally large semiconductor wafer. For example, the wafer may have a thickness of at least 250 microns and a diameter of 101.6 millimeters.

In a first step, an oxide layer is formed on the top surface of the wafer. For example, a silicon dioxide may be thermally grown and then photolithographically patterned to provide a channel stop mask for a subsequent diffusion step. Typically, the thermally grown oxide is simultaneously formed on the bottom side of the wafer, but is removed with the selected portions on the top side. The wafer is then phosphorous diffused in the exposed channel stop and along the bottom side of the wafer. This forms the N-junction at the bottom surface and forms the channel stop which inhibits current leakage that might otherwise result from surface inversion.

In the next step, a thermal oxide is grown to cover the channel stop diffusion and to cover the bottom side of the wafer. The functions of the oxide are to reduce stress on the channel stop diffusion and to provide an etch stop for a subsequent bottom side nitride etch.

A nitride layer (typically silicon nitride) is deposited at both the top side and the bottom side of the wafer. Conventional low pressure chemical vapor deposition (LPCVD)

processing may be used. A pit etch mask can then be formed from the thermal oxide and the nitride layers in order to expose a square area in which the pit is to be etched. The nitride is dry etched using a conventional dry etch process. The thermal oxide on the top side is wet etched in order to define the area for the pit. While the array of pits formed in a large wafer may have a constant pitch, the creation of pits should terminate approximately 3.175 millimeters from the edge of the wafer, in order to reduce the susceptibility of the wafer to breakage. Edge formation of pits may be prevented by providing the proper design of the pit etch mask or by subsequently coating the outer edge of the wafer with photoresist.

The exposed silicon within a square perimeter of the pit etch mask is anisotropically etched in KOH or other anisotropic etchant to form the pit. The nitride on the bottom side of the wafer protects the bottom side from being etched. If the etching is allowed to continue until it reaches an apex in the inverted pyramid, etching will effectively cease when it reaches the inverted apex, since it will be reduced to a speed of one-tenth of its original etch rate. Thus, it is possible to easily control the depth of the etch by controlling the size of the square opening at the top side. Rectangles may also be etched, if it is desired to increase the effective junction area at the inverted apex. While a rectangular opening will cause the pit to include a longitudinally extending apex, the pit will have a shape that will be referred to herein as "pyramidal," since it will include the four walls which slope at substantially equal angles toward the apex.

The P-type junction is then formed by exposing the converging walls of the pit to a boron diffusion. The depth of the diffusion may be 4 microns. This diffusion step also drives the bottom side phosphorous diffusion to a depth of approximately 5 microns, even though the bottom side is still protected by the nitride layer. Optionally, the sequence of the phosphorous and boron diffusions may be reversed, so that the interior walls of the pit provide the N-type region, rather than the P-type region.

In the next step, the boron diffusion within the pit is protected from the effects of a subsequent phosphorous getter step of the bottom side diffusion. Preferably, the pit is oxidized to provide the protection. The bottom side nitride is then dry etched, with the underlying oxide being used as an etch stop. The bottom side etch stop is then removed in order to expose the silicon. However, the oxide within the pit remains intact. For example, a float etch step may be used to remove the bottom side oxide.

The getter step is performed to remove impurities from the phosphorous-doped bottom side, thereby improving the carrier lifetime of the diode. The oxide in the pit is then removed and a standard metallization is deposited on the top side of the wafer.

A self-alignment top metal masking process is performed in order to remove the top metallization from areas outside of the pit. An acetone primer is applied to the front surface of the wafer to wet and fill the pits. Photoresist is spread onto the wafer. The acetone primer mixes with the photoresist and quickly diffuses into the pits, thereby inhibiting the formation of bubbles. Excess photoresist is removed from the surface of the wafer. Preferably, the wafer is exposed in a mask aligner without a mask and with a lower than normal exposure intensity. That is, the top side is blanket exposed, preferably with an intensity that is 25 to 33 percent of normal. This completely exposes any residue photoresist on the top surface of the wafer, but the thick resist within the pits does not receive sufficient exposure to develop out. The wafer is then developed, thereby removing the residual film of photoresist on the top surface, while leaving the photoresist in the pits intact. A standard masking process can be employed at this point. Optionally, the mask may be slightly larger than the pit, so that the mask extends beyond the pit and leaves a small ring of unetched metal around the top of the pit on the nitride layer that provides passivation. The exposed metal on the surface of the wafer is then etched using conventional techniques. The photoresist within the pit is removed, leaving only the metal for forming a connection to the diffusion region in the pit. The bottom side of the wafer is metallized using conventional techniques, so as to form an ohmic contact to the bottom diffusion region.

In some applications, a C-bend contact approach is used to provide electrical connection to the pit. In these applications, the wafer can be wax mounted onto a holder with electrical contact made to the bottom side of the wafer. Through-plating can be performed normally. The ring of metal on the top surface nitride layer begins to plate, even though it is not initially making physical contact with the metallization within the pit. Eventually, the plated metal in the pit and the ring on the top surface merge, forming an electrical contact.

Optionally, the steps of performing the channel stop mask and diffusion can be performed after the pit is etched and the desired dopant is introduced into the walls of the pit. In this optional approach, the channel stop is unpassivated. This allows the wafer to remain relatively thick (greater than 406.4 microns) through half of the process, before the wafer is thinned and the bottom surface receives the dopant diffusion. Thus, the potential of wafer breakage is further reduced.

In another alternative process, the channel stop masking step is eliminated. Some work has been done to determine whether surface inversion can be averted, so that the masking step can be eliminated. Experiments of very lightly doping the intrinsic surface of the wafer with phosphorous in order to discourage surface inversion have been conducted. Ideally, the top pit PIN process can be reduced to two masking steps using a single mask.

There are a number of advantages to the fabrication process and the diode device that is formed by the process. The unique inverted pyramidal pit at the top side of the substrate allows thick wafers to be used in the fabrication of interactive regions. Thus, the electrical performance of a PIN diode is enhanced relative to conventional PIN diodes that are fabricated from wafers having a comparable intrinsic layer thickness using conventional techniques. The electrical properties include low series resistance (Rs), low capacitance and a reduced front contact resistance.

The process of forming the anisotropically etched pit is easily controlled and repeated. There is very little undercutting, so that the lateral geometries are repeatable. Vertical etching is very uniform and much more easily controlled than in isotropic etches.

The design of the diode device lends itself to a simple and efficient three-mask process using short diffusion times. Cycle time is almost half of that of conventional bulk PIN processes. Almost all of the steps are value added and many process steps serve multiple purposes. For example, the nitride on the top side of the substrate serves as a pit etch mask, a mask against the top diffusion, an oxide etch mask, and a final top passivation for the diode device. As another example, the nitride on the bottom side of the substrate serves as a mask that prevents the top diffusion from being introduced into the back surface of the wafer and prevents the pit etch from attacking the bottom side of the substrate.

DETAILED DESCRIPTION

Figure 2:
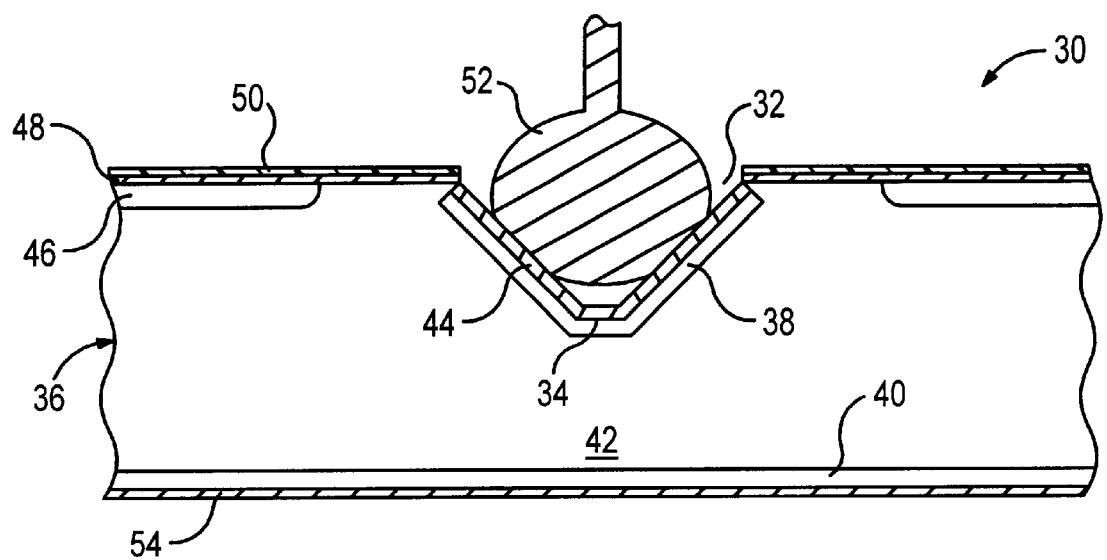
FIG. 2 is a side sectional view of a first embodiment of a PIN diode fabricated in accordance with the invention.

With reference to FIG. 2, a PIN diode 30 is shown as having a top surface in which an inverted pyramidal pit 32 is formed. As will be described fully below, anisotropic etching is used to form the pit 32. In the embodiment of FIG. 2, the anisotropic etching was terminated prior to the pyramidal pit reaching an apex. Therefore, the pyramidal shape is a truncated one, providing a flattened area 34. However, an embodiment in which the anisotropic etching provides a completed V-shaped pit will be described with reference to FIGS. 7–18.

While the invention will be described primarily with reference to a PIN diode, the invention may be used in other applications. Preferably, the steps that will be described with reference to FIGS. 7–18 are used to form diode devices, but other uses of the process to form pits have been contemplated.

In the preferred embodiment, the pit 32 is formed in a silicon substrate 36. The anisotropic etching is accomplished by a process on <100> crystal oriented silicon material. In the case of PIN diodes, the series resistance (Rs) of the device is relatively insensitive to the junction area. In FIG. 2, the P-doped region 38 is along the walls of the pit, while the N-doped region 40 is at the bottom surface of the substrate 36. However, the two regions may be reversed without diverging from the invention. While the Rs is relatively insensitive to the junction area, it is very sensitive to the thickness of an intrinsic region 42 that is sandwiched between the top side P-doped region 38 and the bottom side N-doped region 40. The Rs will vary roughly as the square of the distance between the two regions 38 and 40. Thus, the bottom of the pit 32 will primarily determine the Rs characteristics of the PIN diode 30.

Another feature of the PIN diode 30 formed in accordance with the invention is that the area of the top side contact metallization 44 to the diffusion region 38 is relatively large, whereas the junction capacitance is relatively small. This is because the walls of the pit 32, which form the top junction and are completely covered with metal, progressively move further from the bottom side junction 40, since the walls slope at an angle of approximately 56 degrees along the crystal plane toward the top surface of the substrate 36. Thus, the PIN diode 30 has a very low top contact resistance, a low junction capacitance, and a relatively low Rs.

The PIN diode 30 also includes a ring-shaped channel stop 46, a silicon dioxide layer 48, and a silicon nitride layer 50. A conventional ball bond 52 provides contact with external circuitry. A bottom side metallization 54 provides the contact to the N-doped region 40.

While the pit 32 of FIG. 2 includes the flattened area 34, typically the pit formed in accordance with the invention includes an apex. The partially etched pit of FIG. 2 may be used in applications in which a greater ball bond-to-metallization contact region is desired. However, another way of achieving the greater contact area is to form a rectangular opening for the anisotropic etch, so that the pit will have a longitudinally extending apex. Even in the applications in which the pit has a longitudinally extending apex, the cross section will have the shape of an inverted pyramid. Etching to an inverted apex has the advantage that since <100> crystal planes etch more than ten times faster than <110> crystal planes, the etch rate will decelerate to less than one-tenth of its original etch rate once the etching process reaches the bottom apex. As a result, the process essentially has its own etch stop. Moreover, there is very little undercutting.

Figure 3:
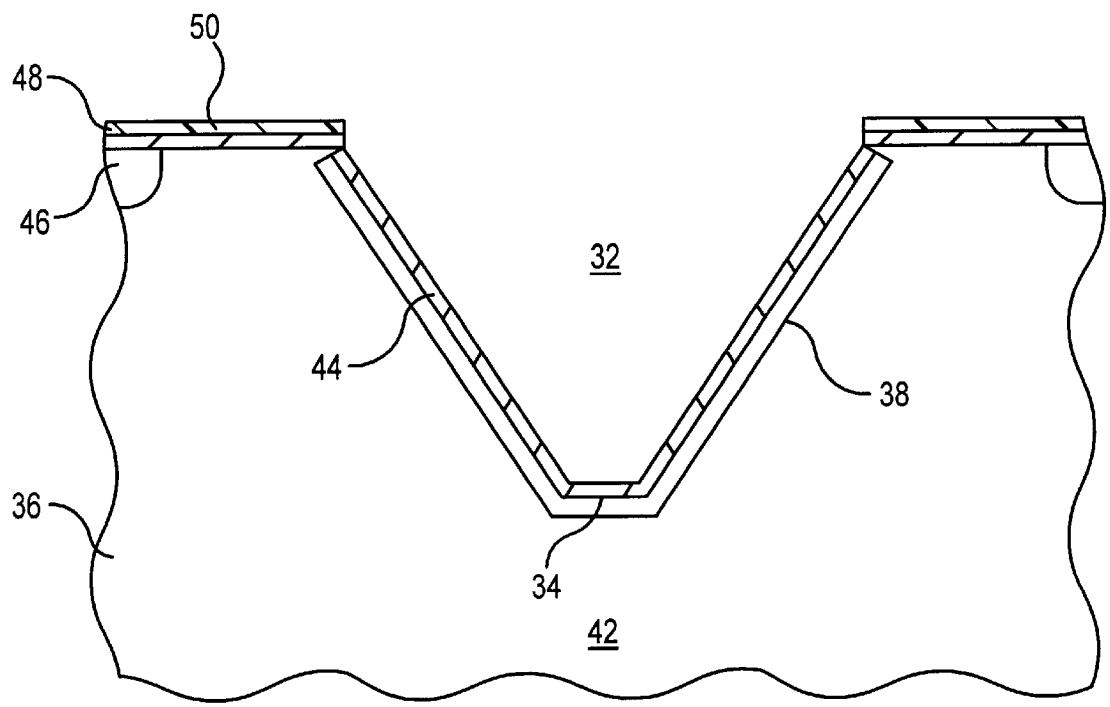
FIG. 3 is a side sectional view of the anisotropic etched top side pit of FIG. 2.

FIG. 3 is a sectional view of the pit 32 within the substrate 36. The metallization 44 may be NiCr/Au, but this is not critical. A platinum silicide may also be used to improve contact resistance, if needed. The P-type region 38 may be a diffusion of boron to a depth of approximately 4 microns. However, as noted above, the region 38 may be the N-doped junction without diverging from the invention. The channel stop 46 may be formed by a phosphorous diffusion to a depth of approximately 2 microns. The channel stop forms a reverse junction at the top surface of the substrate 36 in order to hinder leakage current that would otherwise result from surface inversion. Without the channel stop, there is a concern that the breakdown voltages of the PIN diode would be low and unstable. However, experiments have been conducted to determine whether light phosphorous doping of the intrinsic top surface of the substrate 36 sufficiently retards surface inversion to eliminate the channel stop mask that will be described below.

While the intrinsic region 42 is ideally free of chemical impurities and crystal growth imperfections, some impurities will exist. In fact, some applications may benefit from intentional introduction of impurities. However, the process is preferably as free of impurities and imperfections as practically possible.

Figure 4:
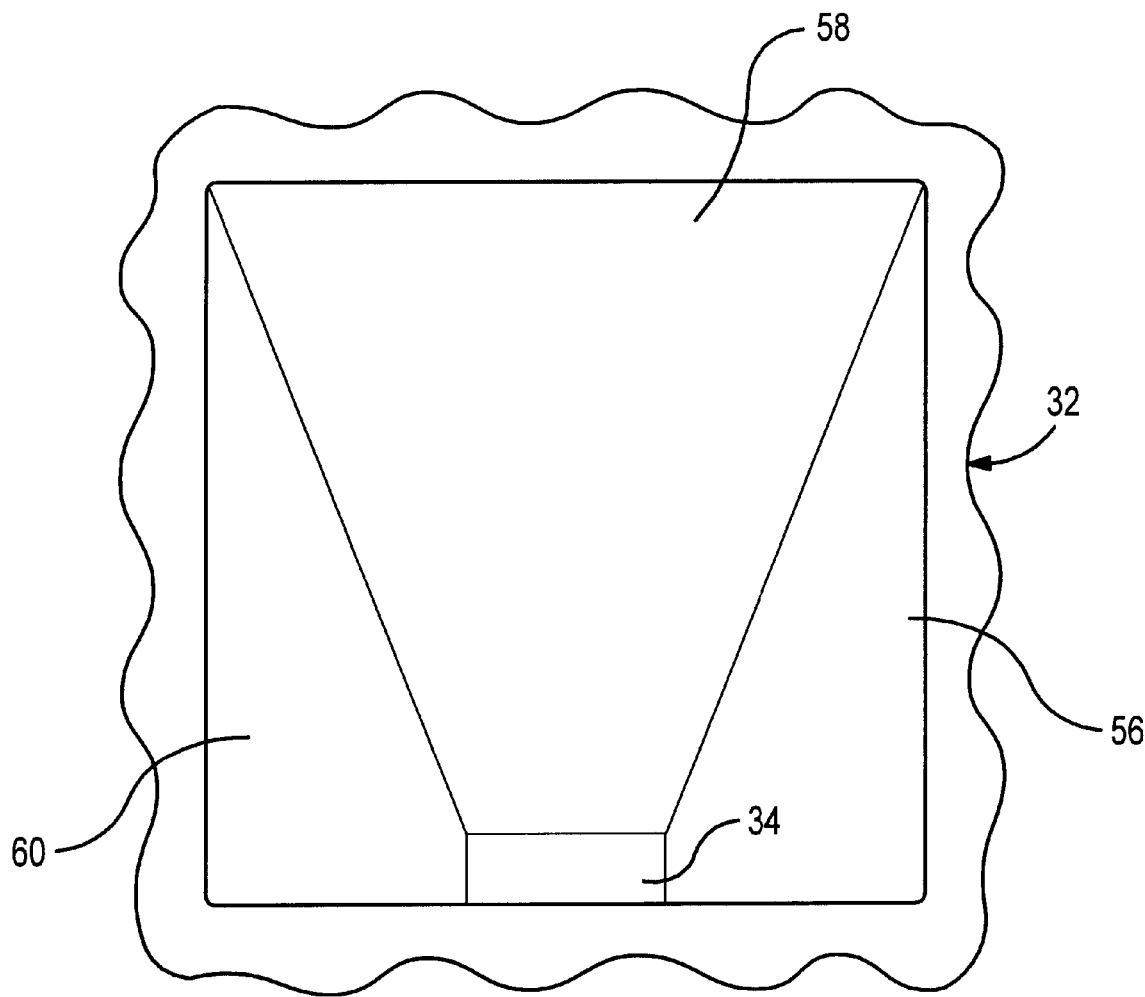
FIG. 4 is a perspective view of the pit of FIG. 3.

The anisotropically etched pit 32 is shown in a perspective view in FIG. 4. Because the etching process was terminated prior to the pit reaching an apex, the pit includes the flattened area 34. Three of the four walls 56, 58 and 60 are shown in the figure. The walls are identical, since the opening that was formed for the etching was square. As previously noted, a rectangular opening may be formed in order to provide a longitudinally extending apex or a longitudinally extending flattened area 34.

Figure 5:
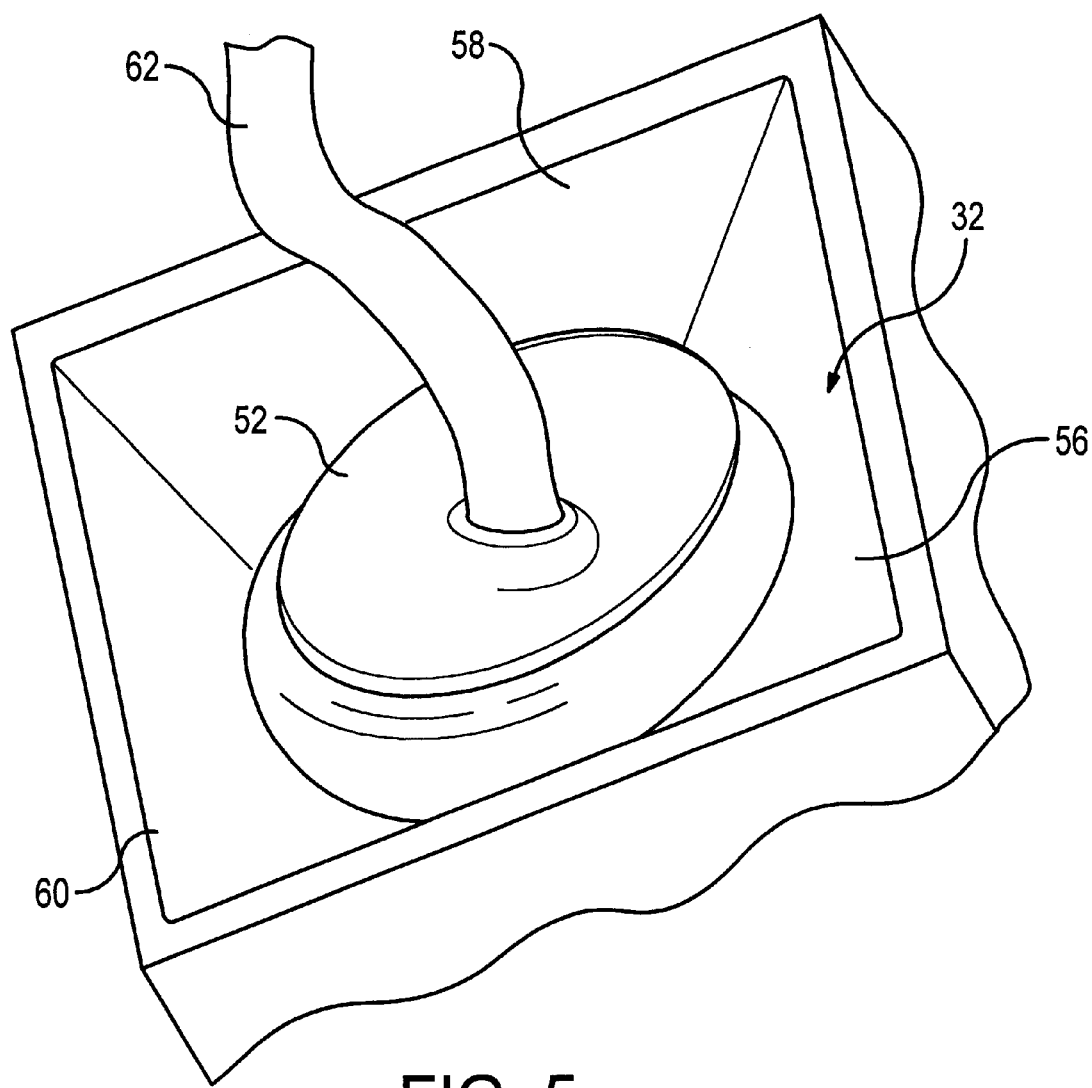
FIG. 5 is a perspective view of the pit of FIG. 4, with a ball bond added to the pit.

Referring now to FIG. 5, a ball bond 52 is shown as being formed within the pit 32 in order to contact the walls 56, 58 and 60. The ball bond includes a bond wire 62 that extends to processing circuitry, not shown. The formation of the ball bond is well known in the art and will not be explained herein.

Figure 6:
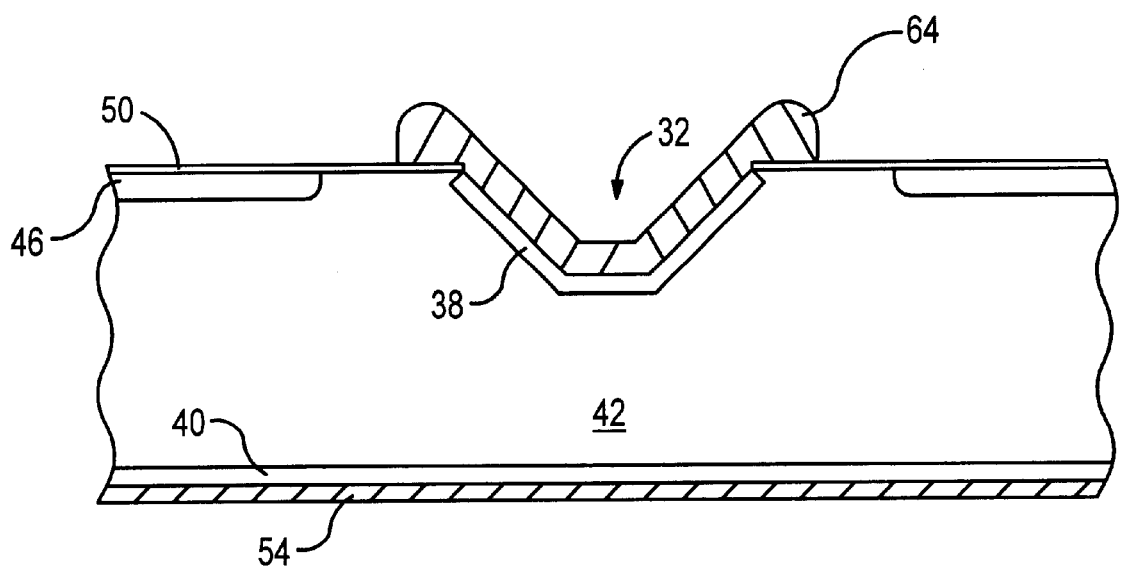
FIG. 6 is a second embodiment of a PIN diode having a top side anisotropically etched pit and plated pit and top ridge in accordance with the invention.

A second embodiment of the invention is shown in FIG. 6. Rather than the formation of a ball bond within the pit 32, a ridge 64 of plated metal is created. For example, a maskless through-plating process may be employed to form a ridge that is 20 microns to 30 microns high around the top periphery of the pit 32. In some glass packages, a C-bend member is used as the contact to the front junction 38 of the PIN diode. The ridge 64 may be used in such applications.

Figure 1:
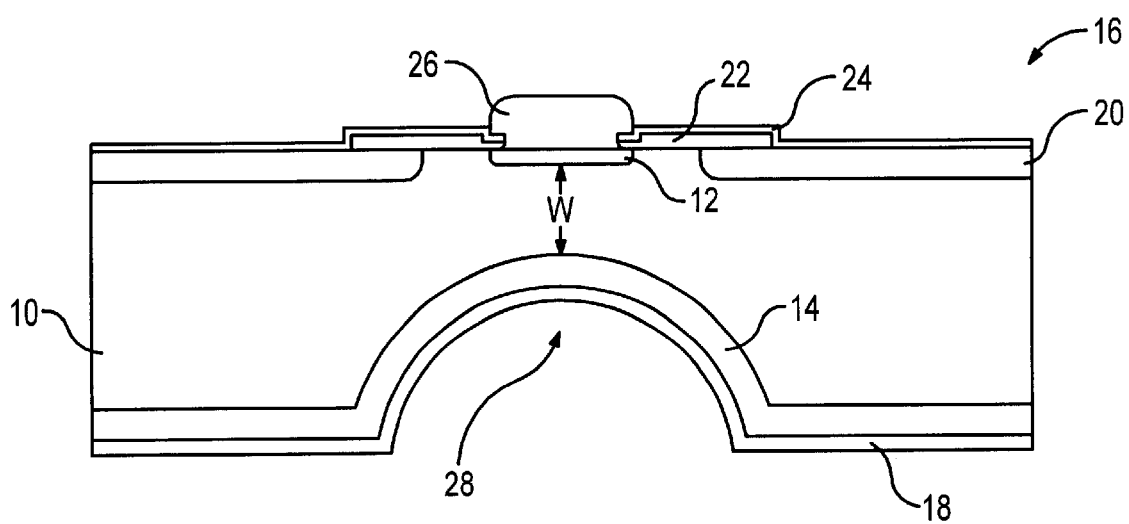
FIG. 1 is a side sectional view of a prior art PIN diode structure, which includes an isotropic pit on a bottom surface of the substrate on which the diode is formed.

The process steps for forming the PIN diode 30 of FIG. 2 will be described with reference to FIGS. 7–18. As previously noted, the pit 32 is formed by anisotropically etching the silicon substrate 36. The geometry of the anisotropic silicon pit etch can be easily controlled. There is very little undercutting, so that the control of lateral pit geometries is more easily controlled than in the isotropic etching process for forming the prior art pit 28 of FIG. 1. Vertical etching is also very uniform and more easily controlled, relative to the isotropic etches, since the anisotropic etching includes the self-stopping feature for apex silicon etched devices.

Figure 7:
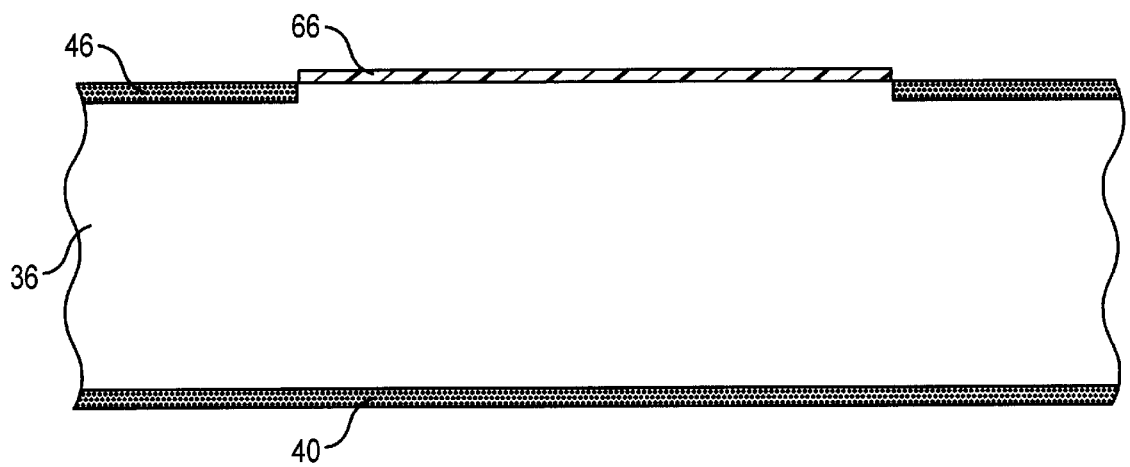
FIGS. 7–18 are side sectional views showing process steps for forming a third embodiment of a PIN diode having an anisotropically etched top side pit formed in accordance with the invention.

The process flow of steps will be described for a PIN diode in which the pit diffusion region 38 is a P-doped diffusion, while the bottom diffusion 40 is N-type. This is the preferred embodiment, since the phosphorous gettering at the bottom side of the wafer is relatively trivial. As a first step, a wafer 36 is provided. Typically, wafers are pre-lapped by a vendor. In FIG. 7, the wafer may have a thickness in the range of 254 microns to 305.8 microns. The diameter of the wafer may be 101.6 millimeters, so that a large number of identical pits may be formed simultaneously. Fabrication of the array of PIN diodes within a relatively large wafer is possible because the wafer is thicker than the wafer used to form conventional PIN diode 16 of the type described with reference to FIG. 1. Moreover, shallow diffusion regions can be used because the top pit PIN diode does not depend upon deep diffusions to reduce the distance through the intrinsic layer.

A first processing step is to thermally grow an oxide on the surfaces of the wafer 36. The thermal oxide is used to provide a mask for the following phosphorous diffusion. Standard photolithographic techniques and field etching may be used to pattern the thermal oxide to form a channel stop mask on the top surface and to remove the thermal oxide from the bottom surface. The patterned thermal oxide 66 is shown in FIG. 7.

After formation of the channel stop oxide 66, phosphorous diffusion is performed to provide the channel stop 46 and the N-junction region 40. At this point, the diffusion may be 2 microns deep, with a solid solubility at 1025 degrees Celsius.

Figure 8:
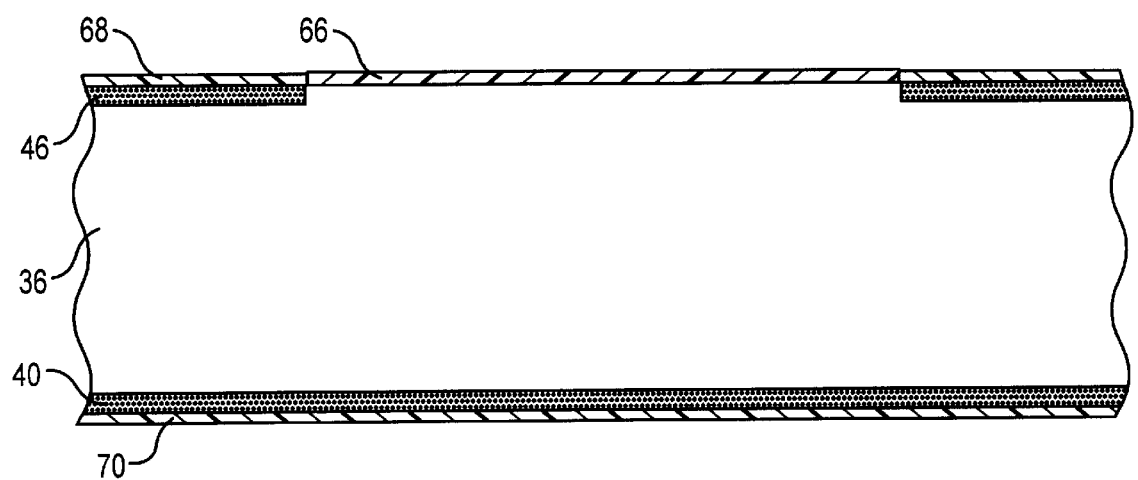

In FIG. 8, thermal oxide layers 68 and 70 are grown on the opposite sides of the wafer 36. The oxide 68 on the top surface is formed on the channel stop diffusion 46 to reduce stress on the diffusion. The oxide layer 70 on the bottom surface functions as an etch-stop for a subsequently performed nitride etch.

Figure 9:
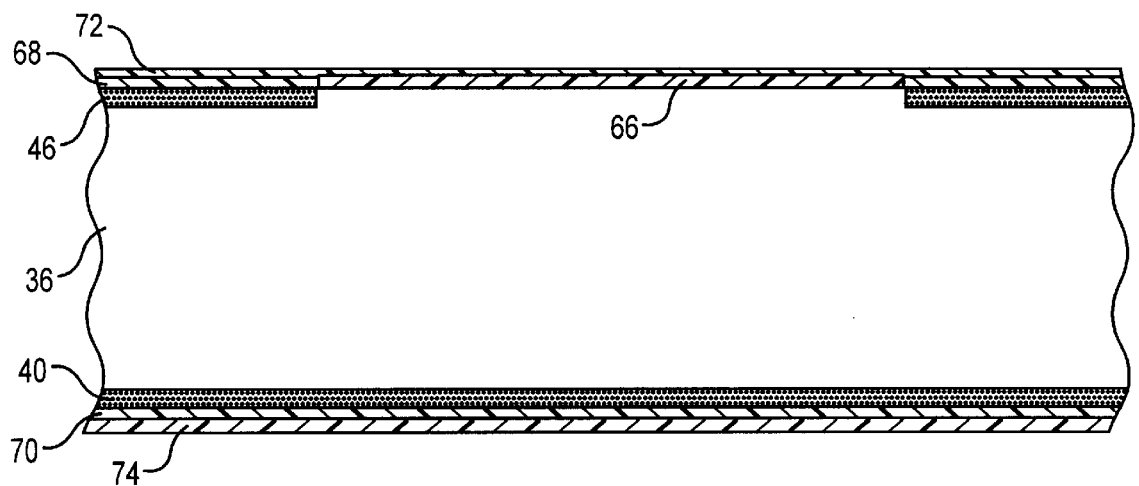

In FIG. 9, silicon nitride layers 72 and 74 are formed on the opposite sides of the wafer 36. In various subsequent processing steps, the nitride layer 72 on the top side serves as a pit etch mask, a mask against a top boron diffusion, an oxide etch mask, and the final top passivation for the PIN diode. The bottom nitride layer 74 serves as a mask preventing the top diffusion from going into the back side of the wafer and prevents the pit etch from attacking the back side of the wafer.

Figure 10:
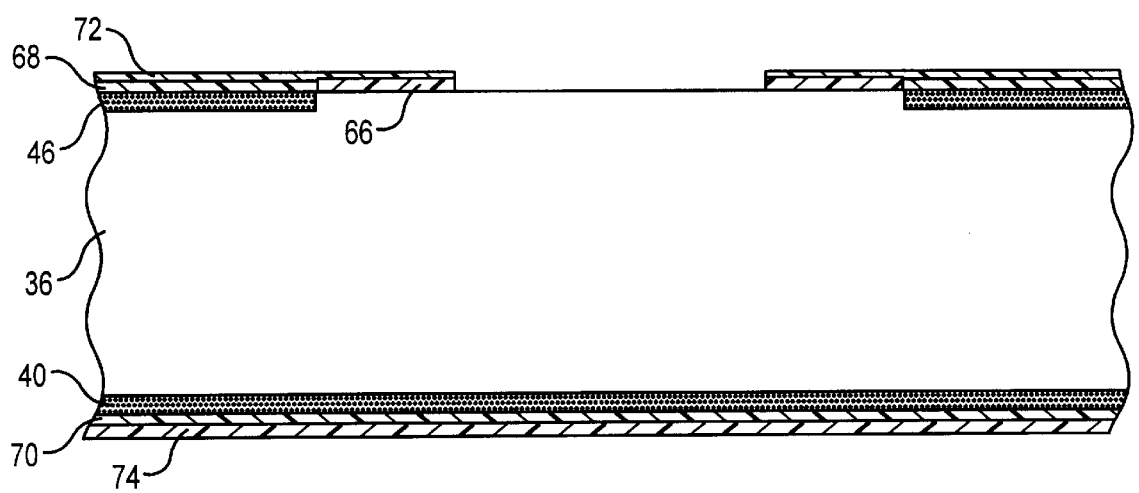

The wafer 36 then receives the pit etch mask, as shown in FIG. 10. In the preferred embodiment, the opening that defines a pit etch area is a square pattern having sides in the range of 120 microns to 170 microns. The appropriate area of the top nitride layer 72 is exposed by the mask. The exposed nitride is dry etched by a conventional dry etch process. Then, the portion of the first thermal oxide layer 66 that is exposed by removal of the nitride is wet etched to expose a portion of the silicon. The bottom side nitride is left intact.

From a practical point of view, it is important that the creation of pits be avoided within the areas adjacent to the edges of the wafer 36. Forming pits closer than 3.175 millimeters from a wafer edge carries the risk of causing excessive wafer breakage. Breakage typically starts at the edge of a wafer. The pits at the edge of a wafer will create weak regions that are vulnerable to breakage. Edge pits may be avoided by providing a proper design for the pit etch mask or by coating the outer edge of the wafer with photoresist after the pit etch mask is developed.

Figure 11:
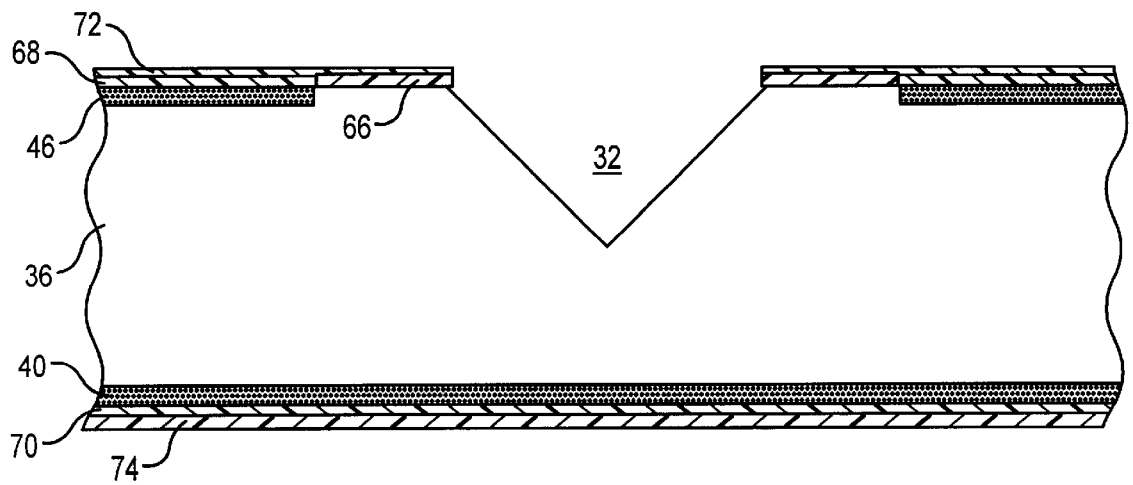

In FIG. 11, the pit 32 is etched into the silicon wafer 36. Silicon exposed by patterning the nitride layer 72 in the oxide layer 66 is anisotropically etched in KOH or some other anisotropic etchant. The nitride layer 74 on the bottom side of the silicon wafer 36 protects the bottom from being etched. The pit etching produces the inverted pyramid described above, but in FIG. 11, the etching is allowed to proceed to an apex. The etching process does not stop when the apex is reached, but does decelerate to about ten percent of its original etch rate. Thus, it is easily possible to control the depth of the etch by controlling the size of the square opening through layers 66 and 72. Optionally, the opening may be rectangular, so that the sectional view of the pit will be pyramidal, but the pit will include a longitudinally extending apex.

Some lateral etching will occur during formation of the pit 32. As a result, the nitride layer 72 will include a lip that extends over the pit. Only a minor overhanging nitride lip is shown in FIG. 11. The extent of the overhang will depend upon a number of factors, particularly the length of time that the etching process is allowed to continue after an apex has been reached. If the process is terminated immediately upon reaching the apex, the overhang will be approximately ten percent of the depth of the pit 32.

Figure 12:
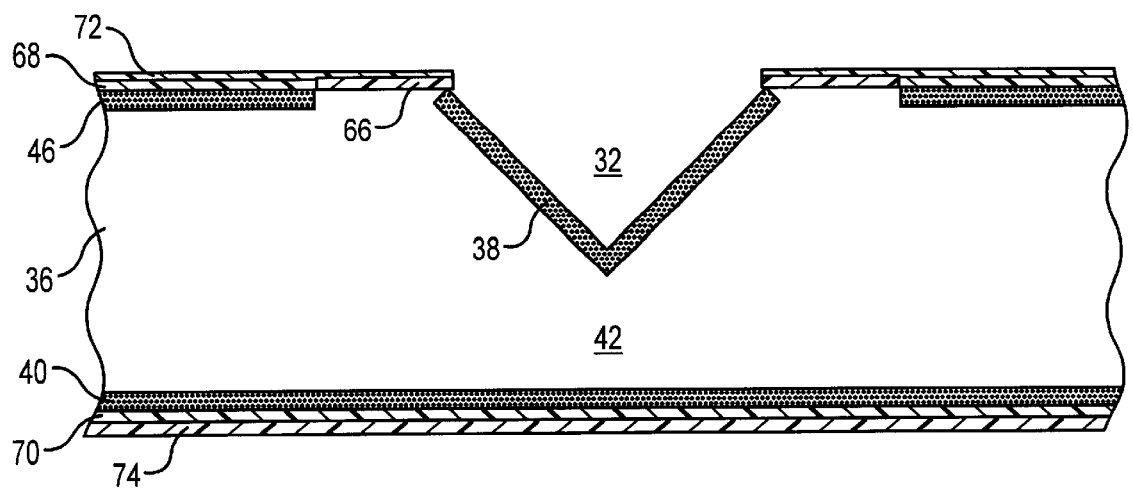

In FIG. 12, the exposed side walls of the pit receive a solid solubility boron diffusion to a depth of approximately 4 microns. This is shown by the P-type diffusion region 38 in FIG. 12. As is well known in the art, the anisotropic etch will provide side walls having a slope of approximately 56 degrees. The diffusion region 38 therefore has walls that converge at 56 degree angles with approach to the bottom side of the wafer 36. The process of diffusing boron into the region 38 drives the bottom side phosphorous diffusion deeper into the substrate, even though the bottom side is protected by the nitride layer 74. The phosphorous drive provides a region 40 having a depth of approximately 5 microns.

Figure 13:
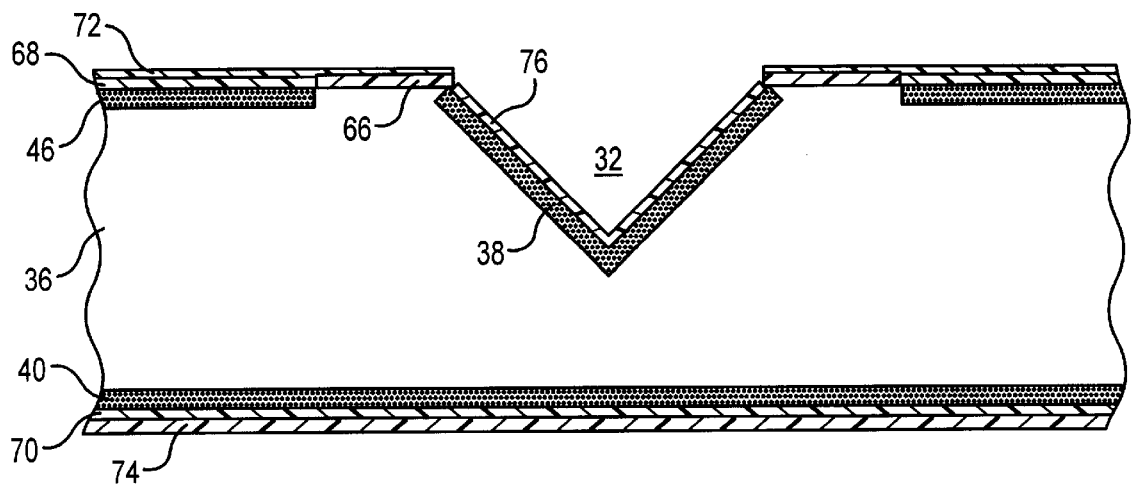
Figure 14:
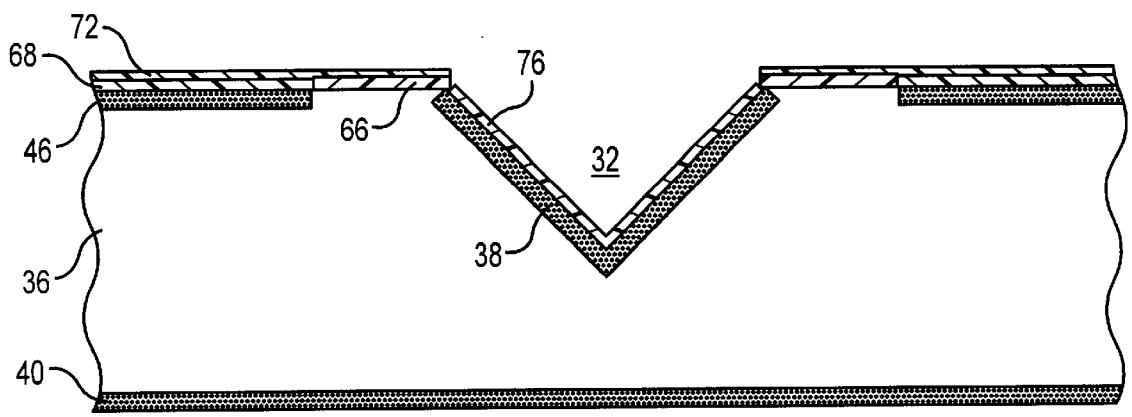

In FIG. 13, the side walls of the pit are oxidized to form a layer 76. The oxide layer 76 provides protection of the boron diffusion region 38 against a subsequent phosphorous getter on the bottom side of the substrate 36. The nitride layer 74 on the bottom side of the wafer is then etched. In this step, the oxide layer 70 is used as an etch stop. The bottom side of the wafer is then float etched to remove all of the remaining oxide layer 70 and to expose the silicon, as shown in FIG. 14. The oxide layer 76 within the pit 32 remains intact.

The getter process is then performed. For example, the wafer 36 may be placed adjacent to a second wafer in a single slot of a conventional furnace boat, with the top surfaces of the two wafers being adjacent to each other. This protects the top sides of the wafers 36 from diffusion and exposes the bottom sides of the wafers to the phosphorous source for the getter process. The wafers are phosphor gettered on the back side to a depth of approximately 2 microns.

Figure 15:
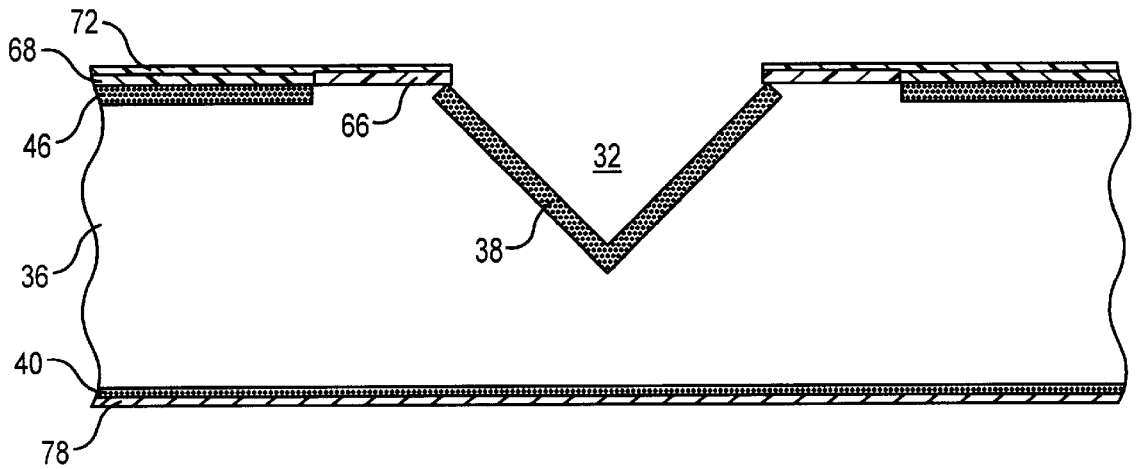

Following the getter process, the wafer 36 is placed in an isopropyl alcohol primer that is used as a wetting agent to fill the pits 32. The wafers may then be placed in straight HF to remove the oxide layer 76 from the pits, as well as to remove any phosphorous glass from the bottom side of the wafer. FIG. 15 shows the oxide removed from the pit 32 and shows a gettered portion 78 of the bottom side diffusion 40.

Figure 16:
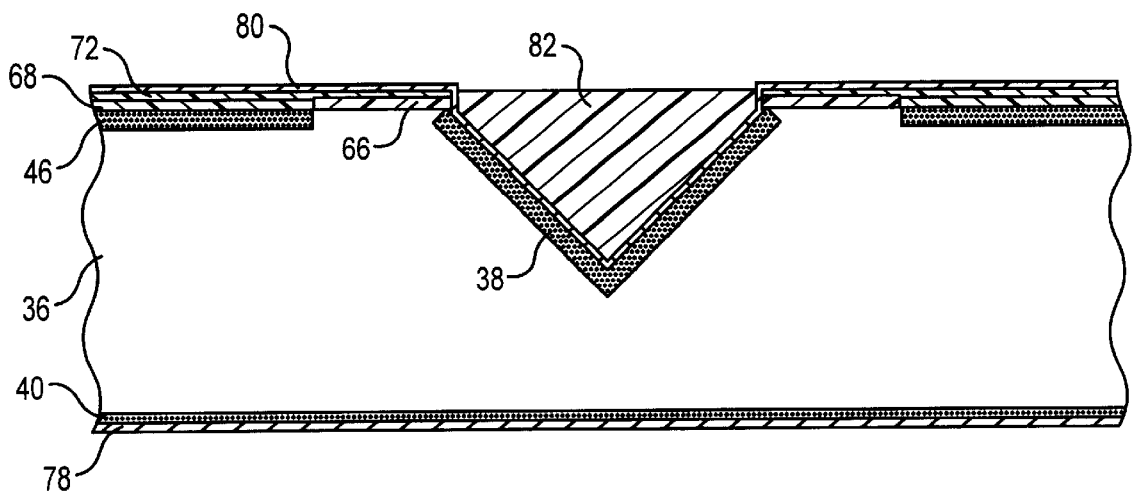

A standard top metallization process is used to form an ohmic contact on the top surface of the device of FIG. 15. As one option, the metallization may be a NiCr/Au arrangement. A platinum-silicide can also be employed to improve the contact resistance, if needed. FIG. 16 shows the top metallization 80. The figure also shows a photoresist 82 within the pit. The photoresist is formed as part of a maskless self-aligned patterning process for the top metallization 80. The patterning process includes filling the pit with an acetone prime that is applied to the top surface of the 36. The photoresist is spread over the entirety of the wafer. It is not necessary to use a spinner to apply the photoresist. The application of the photoresist may be performed on a fixture designed to hold multiple wafers in which each wafer includes an array of pits for forming PIN diodes. The acetone in the pits mixes with the photoresist and quickly diffuses into the pits, retarding the formation of bubbles.

Excess photoresist on the surface of the wafer 36 is removed with a squeegee-like device, but the resist remains within the pits. A razor blade has been used in the past because of convenience, but other devices, such as a softer pliable material, may be used.

The wafer is blanket exposed to a low intensity mask aligner. For example, the intensity may be 25 percent to 33 percent of normal exposure. A simple box with infrared/ultraviolet light sources can be used to both infrared bake and ultraviolet expose many wafers simultaneously. The residual resist on the top surface of the wafer 36 will be completely exposed, whereas the thicker resist within the deep pits will not receive sufficient exposure to develop. The shadowing effects of the overhanging nitride lip described above will aid in minimizing exposure near the very top of the pit. The wafer is then developed, removing any residual film of photoresist on the top surface, but leaving the photoresist 82 within the pit intact.

A standard masking process can then be employed. A mask that is slightly larger than the pit may be used, so that the mask extends beyond the pit and leaves a small ring of unetched metal around the top of the pit and on the nitride passivation layer 72. This process of leaving the small ring on the passivation layer is particularly useful if through-plating is needed for forming the ridge 64 of plated material described with reference to FIG. 6.

Figure 17:
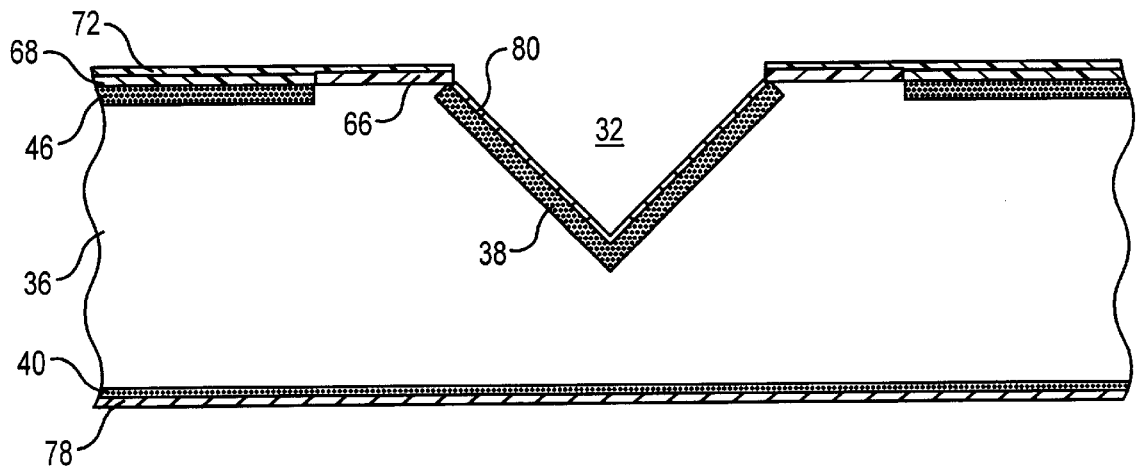

The exposed portion of the top metallization 80 is etched in a conventional manner. The photoresist 82 within the pit may be removed by a conventional photoresist removal process. FIG. 17 shows a resulting structure, but without the narrow ring of metallization that surrounds the pit 32 on the top side of the nitride passivation layer 72.

Figure 18:
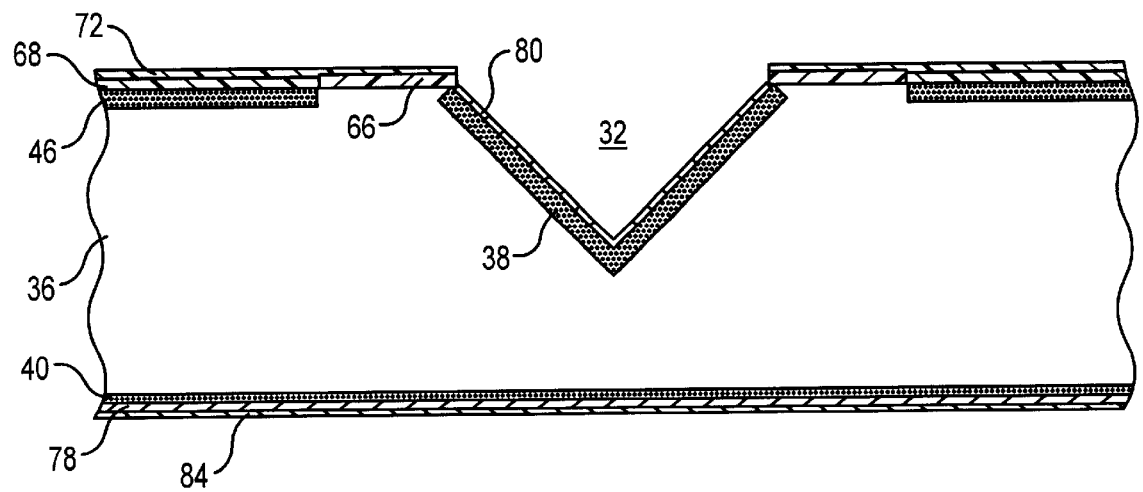

In final processing, additional metallization is formed. In FIG. 18, a bottom metallization 84 of NiCr/Au is formed to provide an ohmic contact. If surface plating is required, as shown in FIG. 6, the wafer 36 may be wax mounted onto a holder with electrical contact made to the bottom of the wafer. Through-plating can be performed using known techniques. The ring of metal, described previously when referring to FIGS. 16 and 17, will plate, even though the ring does not initially make contact with the metallization 80 within the pit 32. Eventually, the plated metal within the pit 32 and the plated metal on the ring merge to form an electrical contact. The wafer can then be normally mounted and cleaned.

As an alternative to the process described above, the steps of providing the channel stop mask and the channel stop diffusion may be executed after the pit etch and boron diffusion. In this optional approach, the channel stop is unpassivated. The advantage is that the wafer may remain relatively thick (greater than 406.4 microns) through half of the process, before the wafer is thinned to allow the bottom surface to receive the dopant diffusion which forms the bottom side diffusion region. Allowing the process to occur while the wafer remains thick reduces the potential of wafer breakage.

Another alternative is to eliminate the channel stop masking step entirely. Some work has been done to determine whether surface inversion can be averted, so that this masking step can be eliminated. If so, the top pit PIN process can be reduced to two masking steps using a single mask.

What is claimed is:

1. A method of fabricating a diode device in a substrate having a top surface and a bottom surface, said method comprising the steps of:

forming first and second active regions in said substrate such that said first and second active regions respectively have first and second conductivity types, including defining an area on said top surface for forming a pit and anisotropically etching a single pit into said area such that said pit extends partially through said substrate and has sidewalls which converge with approach toward said bottom surface, wherein forming said first active region includes introducing a dopant having said first conductivity type into said converging sidewalls of said pit, said first and second active regions being conductively coupled in response to a bias voltage; and forming a conductive material along said converging sidewalls of said pit, including forming the conductive material to be directly coupled to said first active region so that said bias voltage is applied to said first active region via said converging sidewalls.

2. The method of claim 1 wherein said steps of forming said first and second active regions include leaving an intrinsic region of said substrate, said pit being formed into said intrinsic region, said intrinsic region having a third conductivity type different than said first and second conductivity types.

3. The method of claim 2 wherein said steps of forming said first, second and intrinsic regions and said step of etching said pit are cooperative to form a top pit PIN diode.

4. The method of claim 1 further comprising steps of (a) forming a contact member within said pit following said steps of introducing said dopant into and forming said conductive material along said converging sidewalls of said pit and (b) forming an ohmic contact along said bottom surface of said substrate, said second active region being along said bottom surface and being in contact with said ohmic contact.

5. The method of claim 1 wherein said step of anisotropically etching said single pit includes using KOH as an etchant.

6. The method of claim 5 further comprising a step of forming a nitride on said top surface, including:

(1) patterning said nitride as a pit etch stop by exposing said area of said top surface for formation of said pit;

(2) using said nitride as a mask during said step of introducing said dopant; and (3) using said nitride as a top passivation layer for said diode device.

7. The method of claim 1 wherein said step of forming said second active region includes introducing a second dopant into said bottom surface of said substrate and includes simultaneously introducing said second dopant into channel stop regions of said top surface.

8. A method of fabricating a PIN device comprising the steps of:

provided a one-piece substrate structure having an intrinsic region;

introducing a first dopant into a second side of said substrate structure to form a junction region within said intrinsic region;

forming an oxide layer on said junction region;

forming a patterned nitride layer on a selected portion of said intrinsic region at a first side of said substrate structure while leaving an area of said first side exposed for formation of a pit, said first side being opposite to said second side;

applying an anisotropic etchant to said exposed area of said first side such that a pit is formed to have pyramidal walls, said pit being formed partially through said intrinsic region;

Introducing a second dopant into said pyramidal walls of said pit, said first and second dopants being selected such that said substrate structure includes p-doped and n-doped regions spaced apart by said intrinsic region;

forming a first conductive contact in said pit to conform to a geometry of said pyramidal walls; and forming a second conductive contact on said second side, thereby enabling external connections to said PIN device at opposite sides of said substrate structure, so that PIN conduction is provided between said first conductive contact along pyramidal walls of said pit at said first side and said second conductive contact at said second side.

9. The method of claim 8 wherein said step of forming said first conductive contact in said pit includes depositing at least one metal layer in said pit and forming a metallic bond member in contact with said at least one metal layer.

10. The method of claim 8 wherein said step of introducing said first dopant is implemented to simultaneously form a channel stop along said first side of said substrate structure, said step of forming said nitride layer including masking said channel stop and including simultaneously forming a nitride layer on said second side of said substrate structure.

11. The method of claim 10 wherein said nitride layer is removed from said second side but left on said channel stop to function as a passivation layer for said PIN device.

12. The method of claim 8 wherein said step of applying said anisotropic etchant includes using KOH.

13. The method of claim 8 wherein said step of providing said substrate structure includes providing a silicon substrate having a thickness of at least 250 microns.

14. A PIN device comprising:

a single-piece substrate having a top surface and a bottom surface;

an inverted pyramidal pit extending from said top surface to a central intrinsic region of said single-piece substrate, said pit terminating without reaching said bottom surface;

a first diffusion layer along sidewalls of said pit, said first diffusion layer having a first conductivity type;

a first electrical contact along said first diffusion layer of said pit, said first electrical contact being next to said first diffusion layer;

a second diffusion layer along said bottom surface of said single-piece substrate, said second diffusion layer having a second conductivity type opposite to said first conductivity type, said second diffusion layer being spaced apart from said first diffusion layer by said central intrinsic region; and conductive paths along said sidewalls of said pit to said first diffusion layer and to said second diffusion layer along said bottom surface of said single-piece substrate.

15. The PIN device of claim 14 further comprising a channel stop residing on said top surface adjacent to said pit.

16. The PIN device of claim 14 wherein said single-piece substrate is a silicon substrate having a thickness of at least 250 microns.

17. The PIN device of claim 14 further comprising a ball bond in said pit to conduct signals therefrom.

18. The PIN device of claim 14 wherein said first diffusion layer is a p-type junction and said second diffusion layer is an n-type junction.

* * * * *